United States Patent [19]

Murayama et al.

[11] Patent Number: 5,115,293
[45] Date of Patent: May 19, 1992

[54] SOLID-STATE IMAGING DEVICE

[75] Inventors: Jin Murayama; Jun Fukazawa, both of Kanagawa, Japan

[73] Assignee: Fuji Photo Film Co., Ltd., Kanagawa, Japan

[21] Appl. No.: 632,435

[22] Filed: Dec. 5, 1990

[30] Foreign Application Priority Data

Dec. 11, 1989 [JP] Japan .................................. 1-318963
Dec. 11, 1989 [JP] Japan .................................. 1-318964

[51] Int. Cl.$^5$ ...................... H01L 27/14; H01L 31/00
[52] U.S. Cl. ...................................... 357/30; 357/32; 357/45; 357/59
[58] Field of Search ................ 357/30 H, 30 K, 30 D, 357/30 G, 30 I, 24 LR, 31, 32, 45, 59 G

[56] References Cited

U.S. PATENT DOCUMENTS 4,407,010 9/1983 Baji et al. .......................... 357/30 H
4,954,895 9/1990 Akimoto et al. ................ 357/24 LR

FOREIGN PATENT DOCUMENTS 58-131766 5/1983 Japan ................................ 357/30 H
61-127277 6/1986 Japan .

Primary Examiner—Andrew J. James
Assistant Examiner—Sara W. Crane
Attorney, Agent, or Firm—Sughrue, Mion, Zinn, Macpeak & Seas

[57] ABSTRACT

A solid-state imaging device constructed according to the TSL system having a plurality of photodiodes arrayed in matrix form so as to serve as a group of pixels, a vertical selection gate line extending from a vertical scanning circuit, a horizontal selection gate line extending from a horizontal scanning circuit, and a signal read line. A projection made of an impurity layer identical to that of the photodiodes is formed at an end of each of the photodiodes. A first switching transistor is formed by interconnecting the vertical selection gate line made of a polysilicon layer so as to cross over an upper surface of each of the projections. A second switching transistor is formed by laminating a gate portion made of a polysilicon layer on the other upper surface of each of the projections. Horizontal selection gate lines are formed by connecting between the vertically arrayed gate portions and an interconnection made of a conductor layer such as an aluminum layer insulatively laminated above the polysilicon layer. Signal read lines are formed by a conductive layer fabricated by a process identical to that of the conductive layer, and each signal read line is interconnected so that the upper surface of the projection and the upper surfaces of the first and second switching transistors are shielded thereby, and that the signal read line does not come in contact with the conductive layer forming the horizontal selection gate line.

12 Claims, 6 Drawing Sheets

SOLID-STATE IMAGING DEVICE

BACKGROUND OF THE INVENTION

The present invention relates to a solid-state imaging device constructed in accordance with a TSL (Transversal Signal Line) system capable of producing an image free from smearing by reading pixel signals through signal read lines interconnected in a horizontal scanning direction.

MOS-type solid-state imaging devices having a construction as shown in FIG. 5 have been widely used.

This type of solid-state imaging device, which is formed using semiconductor fabrication techniques, includes a light-receiving region 1 for receiving an optical image, a vertical scanning circuit 2, and a horizontal scanning circuit 3 for reading pixel signals.

The light-receiving region 1 has a plurality of photodiodes $P_{11}$ to $P_{nm}$ (where n designates a row position and m, a column position) arrayed in matrix form. Between the photodiodes $P_{11}$ to $P_{nm}$ are vertical selection gate lines $L_1$ to $L_n$, each extending from a respective bit output $b_1$ to $b_n$ of the vertical scanning circuit 2, which is implemented with shift registers, and signal read lines $l_1$ to $l_m$.

Further, as shown in the figure, between the photodiodes $P_{11}$ to $P_{nm}$ and the signal read lines $l_1$ to $L_m$ are connected switching transistors $M_{11}$ to $M_{nm}$ formed of MOS-type field effect transistors (FETs). Each of the switching transistors $M_{11}$ to $M_{nm}$ is turned on and off in accordance with a vertical scanning signal applied from the vertical scanning circuit 2 through respective ones of the vertical selection gate lines $L_1$ to $L_n$, thereby to sequentially transmit the pixel signals of the photodiodes $P_{11}$ to $P_{nm}$ to the signal read lines $l_1$ to $L_n$ every row.

Further, the terminal of each of the signal read lines $l_1$ to $l_n$ is connected to an output line 4 through switching transistors $N_1$ to $N_m$, each composed of a MOS-type FET, for horizontal scanning. Horizontal selection gate lines $a_1$ to $a_m$ extending from bit output contacts $h_1$ to $h_m$ of the horizontal scanning circuit 3 are connected to the gate contacts of switching transistors $N_1$ to $N_m$, respectively. Each of the switching transistors $N_1$ to $N_m$ is turned on and off in accordance with a horizontal scanning signal applied from the horizontal scanning circuit 3 through respective ones of the horizontal selection gate lines $a_1$ to $a_m$, thereby to sequentially transmit pixel signals present on the signal read lines $L_1$ to $l_m$ to the output line 4 and output pixel signals S (n,m) from an output terminal 5 in time sequence.

In this way, the pixel signals generated by the photodiodes $P_{11}$ to $P_{nm}$ are read at a timing specified by the vertical scanning circuit 2 and the horizontal scanning circuit 3, thereby allowing all the pixel signals to be read.

However, the MOS-type solid-state imaging device thus constructed vertically scans an image every predetermined horizontal scanning period using the vertical scanning circuit 2, and horizontally scans the image within each horizontal scanning period using the horizontal scanning circuit 3 in a point-sequential manner. Thus, each of the signal output lines $l_1$ to $l_m$ is scanned once every horizontal scanning period, and as a result, a noise component is superimposed on each of the signal read lines $l_1$ to $l_m$ while waiting for a next scanning operation, thereby causing smearing.

In order to prevent smearing, a MOS-type solid-state imaging device having such a construction as shown in FIG. 6 has been developed. This device is a MOS-type solid-state imaging device of a TSL system, and is distinguished from the solid-state imaging device shown in FIG. 5 in the following points.

Two series-connected switching transistors are connected to each of the photodiodes $P_{11}$ to $P_{nm}$, and one of the switching transistors which is adjacent to the photodiode is vertically scanned by the vertical scanning circuit 2, while the other switching transistor is horizontally scanned by the horizontal scanning circuit 3. When both switching transistors are turned on, a pixel signal from the photodiode corresponding to these switching transistors is read through the horizontally extending signal read line.

Referring to FIG. 6, reference characters $L_1$ to $L_n$ designate vertical selection gate lines; $l_1$ to $l_n$, signal read lines; $a_1$ to $a_m$, horizontal selection gate lines; $Q_1$ to $Q_n$, switching transistors interposed between the signal read lines $l_1$ to $l_n$ and the output line 4, and which are sequentially turned on in synchronism with a vertical scanning signal transmitted from the vertical scanning circuit 2 through the vertical selection gate lines $L_1$ to $L_n$.

The construction of an element E will be more specifically described as a representative example. The two switching transistors f and g are connected in series between the photodiode $M_{11}$ and the signal read line $l_1$. The vertical selection gate line $L_1$ is connected to the gate contact of the switching transistor f, while the horizontal selection gate line $a_1$ is connected to the gate contact of the other switching transistor g. The pixel signal of the photodiode $M_{11}$ is read to the output terminal 5 through the signal read line $l_1$ and the output line 4 while turning the switching transistor g on with the switching transistors f and $Q_1$ turned on by applying a vertical scanning signal from the vertical scanning circuit 2.

The vertical scanning signal is sequentially transmitted from the bit outputs $b_1$ to $b_n$ to the vertical selection gate lines $L_1$ to $L_n$ of the vertical scanning circuit 2 every predetermined horizontal scanning period, and then horizontal scanning signals are sequentially transmitted within the respective cycles from the bit outputs $h_1$ to $h_m$ to the horizontal selection gate lines $a_1$ to $a_m$ of the horizontal scanning circuit 3, thereby allowing all the pixel signals to be read in sequence.

In the solid-state imaging device of such a TSL system, each pixel signal is applied through its signal read line in synchronism with the horizontal scanning-based point sequential scanning cycle. Therefore, the period in which a noise component can be mixed in the signal read line is shorter than o that in the case of the solid-state imaging device shown in FIG. 5, thereby causing smearing to be remarkably reduced.

FIG. 7 shows the construction of a portion of the light-receiving region of the solid-state imaging device of the TSL system shown in FIG. 6. The plan structure of nine pixels is shown as an example.

In the figure, reference character M designates an n+ impurity region embedded in the surface region of a P-well layer formed in a semiconductor substrate, each region M forming a photodiode corresponding to a pixel.

Further, a terminal portion of each n+ impurity region extends in L form, and the L-formed terminal portions are connected to the signal read lines $l_i$, $l_{i+1}$, $l_{i+2}$ (indicated by a one-dot chain line) made of a first aluminum layer through a contact (designated by ⊠ ). Each of the signal read lines $l_i, l_{i+1}, l_{i+2}$ is formed so as to run transversely between the n+ impurity regions constituting the pixels, and is connected to the output line 4 through a predetermined switching transistor among the switching transistors $Q_1$ to $Q_n$ shown in FIG. 6.

Each of vertical gate lines $L_i, L_{i+1}, L_{i+2}$, which formed of a polysilicon layer (shown by a solid line), is laminated so as to be adjoining to each of the signal read lines $l_i, l_{i+1}, l_{i+2}$. The polysilicon layer extending from the side of each of the vertical selection gate lines $L_i, L_{i+1}, L_{i+2}$ covers the upper surface of the L-formed portion in each n+ impurity region. The MOS-type FET switching transistor for vertical scanning (designated by f) is formed by implanting ions in the n+ impurity region close to the covered portion. Each of the vertical selection gate lines $L_i, L_{i+1}, L_{i+2}$ is connected to a predetermined bit output contact of the vertical scanning circuit 2 shown in FIG. 6.

Further, the horizontal selection gate lines $a_j, a_{j+1}, a_{j+2}$ are formed of a second aluminum layer (shown by the dotted line) extending vertically between the n+ impurity regions constituting the respective pixels. A gate portion (designated by F) made of a polysilicon layer that covers the other upper surface of the L-formed portion of the n+ impurity region is connected to the side end of each of the horizontal selection gate lines $a_j, a_{j+1}, a_{j+2}$ through a contact (designated by ▨ ). The MOS-type FET (designated by g) for horizontal scanning is formed by implanting ions in the n+ impurity region adjacent to the portion covered by the gate contact. Here, each of the horizontal selection gate lines $a_j, a_{j+1}, a_{j+2}$ is connected to a predetermined bit output of the horizontal scanning circuit 3 shown in FIG. 6.

The first and second aluminum layers and the polysilicon layer are formed by respective masking processes, and laminated one upon the other through a silicon oxide film layer so as to be insulated from each other.

In the above construction, the vertical scanning circuit 2 and the horizontal scanning circuit 3 perform vertical scanning and horizontal scanning to turn on the switching transistors f and g sequentially at a predetermined timing. As a result, each pixel signal produced at each photodiode can be read in sequence.

However, in such a conventional solid-state imaging device arranged in accordance with the TSL system, as shown in FIG. 7, the drain portions of each pair of switching transistors interposed between each photodiode and each signal read line are not only formed integrally of the same impurity layer as that of the photodiode, but also are of such construction that they are not entirely shielded. Therefore, stray charges induced due to externally incident light are mixed in the pixel signals as a noise.

In addition, to form the vertical and horizontal selection gate lines and the signal read lines, it is necessary to have a total of three layers, i.e., two aluminum layers and one polysilicon layer, thus requiring increased process steps, impairing the yield, and increasing the manufacturing cost.

Moreover, such a conventional solid-state imaging device of the TSL system cannot provide a sufficient dynamic range to prevent saturated exposure. That is, in this solid-state imaging device in which the pixel signal (charges) stored in the photodiode is read through the signal read line, insufficient capacitance of the signal read line may leave some pixel signals unread. Therefore, it is the capacitance of the signal read line that determines the dynamic range of the device. However, the capacitance of the conventional signal read lines ($l_i, l_{i+1}, l_{i+2}$ in FIG. 7) is determined by a parasitic capacitance present between the aluminum layer and the semiconductor substrate. In such a construction, a silicon oxide film layer is employed as a dielectric. This silicon oxide film layer serves to insulate the aluminum layer from the semiconductor substrate. Since this silicon oxide film layer is thick, its capacitance is small, thereby preventing the dynamic range from being increased. In particular, as the number of switching transistors formed between the pixel constituting photodiode and the signal read line is increased, i.e., as the number of pixels is increased, it is necessary to increase the capacitance of each signal read line. However, the higher degree of integration due to increased number of pixels makes it difficult to take measures such as increasing the width of the signal read line, thereby preventing the dynamic range from being increased. On the other hand, if the width of the signal read line is increased to increase the dynamic range, the numerical aperture is decreased, thereby reducing the sensitivity and the like of the device.

In addition, the device is of such a structure as to require that a total of three layers, two aluminum layers and one polysilicon layer, be arranged to form the vertical and horizontal selection gate lines and the signal read lines. This increases the number of steps of the manufacturing process, thereby impairing the yield and increasing the manufacturing cost.

SUMMARY OF THE INVENTION

The invention has been made in view of the above circumstances, and has as an object the provision of a solid-state imaging device constructed in accordance with the TSL system and for which the number of steps of the manufacturing process is reduced, and also having a construction such that the mixture of noise into the pixel signals is prevented by shielding the portions excluding the light injecting region in each photodiode.

Another object of the invention is the provision of a solid-state imaging device having a construction such that the number of manufacturing steps required to produce the device can be reduced, but in which the dynamic range is improved.

In accordance with the above and other objects, the invention provides a solid-state imaging device of a TSL system comprising a plurality of photodiodes arrayed in matrix form so as to serve as a group of pixels; a vertical selection gate line extending from a vertical scanning circuit, a horizontal selection gate line extending from a horizontal scanning circuit, and a signal read line, which lines being interconnected between the photodiodes; a first switching transistor, disposed between the photodiodes and a predetermined signal read line, for performing an on/off operation in synchronism with a vertical scanning signal transmitted from the vertical scanning circuit through the vertical selection gate line; and a second switching transistor for performing an on/off operation in synchronism with a horizontal scanning signal transmitted from the horizontal scanning circuit through the horizontal selection gate line. In the device of the invention, a pixel signal from each of the photodiodes is read in synchronism with signal read scanning at a predetermined timing set by the vertical scanning circuit and the horizontal scanning circuit.

To achieve the object of the invention with such a solid-state imaging device as above, a projection made of an impurity layer identical to that of the photodiodes is formed at an end of each of the photodiodes. The first switching transistor is formed by interconnecting the vertical selection gate line made of a polysilicon layer so as to cross over an upper surface of each of the projections. The second switching transistor is formed by laminating a gate portion made of a polysilicon layer on the other upper surface of each of the projections. The horizontal selection gate line is formed by connecting between the vertically arrayed gate portions and an interconnection made of a conductor layer such as an aluminum layer insulatively laminated above the polysilicon layer. The signal read line is formed by a conductive layer fabricated by a process identical to that of the conductive layer, and each signal read line is interconnected so that the upper surface of the projection and the upper surfaces of the first and second switching transistors are shielded thereby, and that the signal read line does not come in contact with the conductive layer forming the horizontal selection gate line.

According to the invention, to form the vertical and horizontal selection gate lines and the signal read lines, a total of only two layers suffices, thereby allowing the number of conductive layers to be reduced compared to that used in the conventional device. As a result, the manufacturing process is simplified. In addition, to perform the vertical and horizontal scanning, the switching transistor connected to each photodiode is completely shielded by the conductive layer, thereby contributing to greatly eliminating noise.

To further achieve the above and other objects of the invention with such a solid-state imaging device as described above, a projection made of an impurity layer identical to that of the photodiodes is formed at an end of each of the photodiodes. The first switching transistor is formed by interconnecting the vertical selection gate line made of a polysilicon layer so as to cross over an upper surface of each of the projections. The second switching transistor is formed by laminating a gate portion made of a polysilicon layer on the other upper surface of each of the projections. The horizontal selection gate line is formed by connecting between the vertically arrayed gate portions and an interconnection made of a conductor layer such as an aluminum layer insulatively laminated above the polysilicon layer. The signal read line is formed by a conductive layer fabricated by a process identical to that of the conductive layer, and each signal read line is laminated so as to overlap on the upper surface of each vertical selection gate line through an insulating layer made of a silicon oxide film.

According to the invention having the construction thus described, a total of two layers suffices to form the vertical and horizontal selection gate lines and the signal read lines. Therefore, it is possible to reduce the conductive layer compared to the conventional device, thereby contributing to a simplification of the manufacturing process.

Moreover, the capacitance of each signal read line is determined by the parasitic capacitor produced between each signal read line and each vertical selection gate line formed through and below the insulating layer. In this case, the insulating layer is formed thinner than the insulating layer laminated on the semiconductor substrate in the conventional case, thereby allowing the capacitance to be larger than was previously possible. When the inventors measured the capacitance in a conventional construction and a device of the invention with the width of the signal read lines being equal to each other, the latter exhibited about a 30% increase in capacitance, together with the advantage of an increased dynamic range.

DESCRIPTION OF THE PREFERRED EMBODIMENTS

Preferred embodiments of a solid-state imaging device of TSL system according to the invention will now be described with reference to the drawings.

Figure 1:
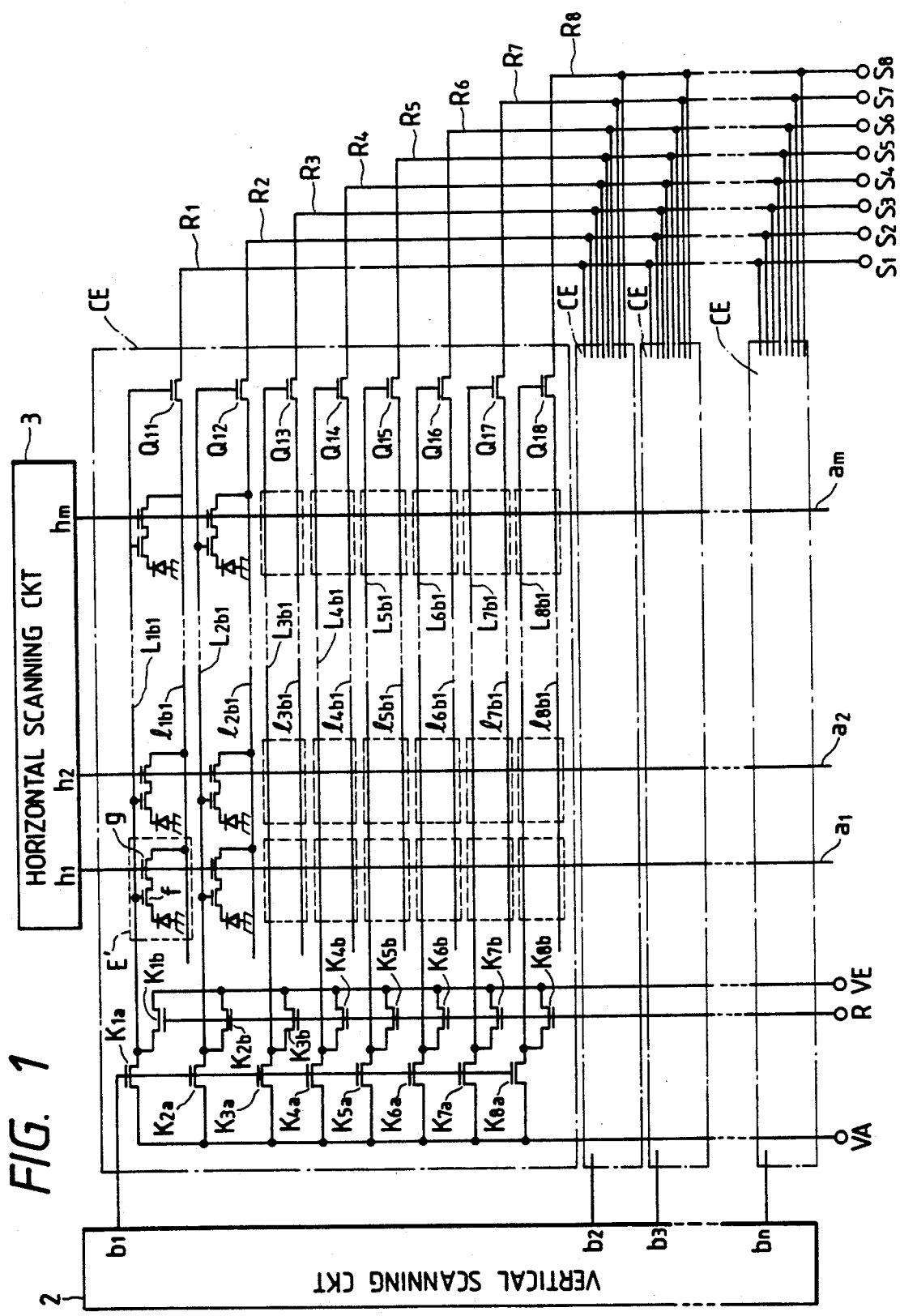
FIG. 1 is a diagram for explaining the construction of a preferred embodiment of the invention in the form of a solid-state imaging device constructed in accordance with the TSL system.
Figure 5:
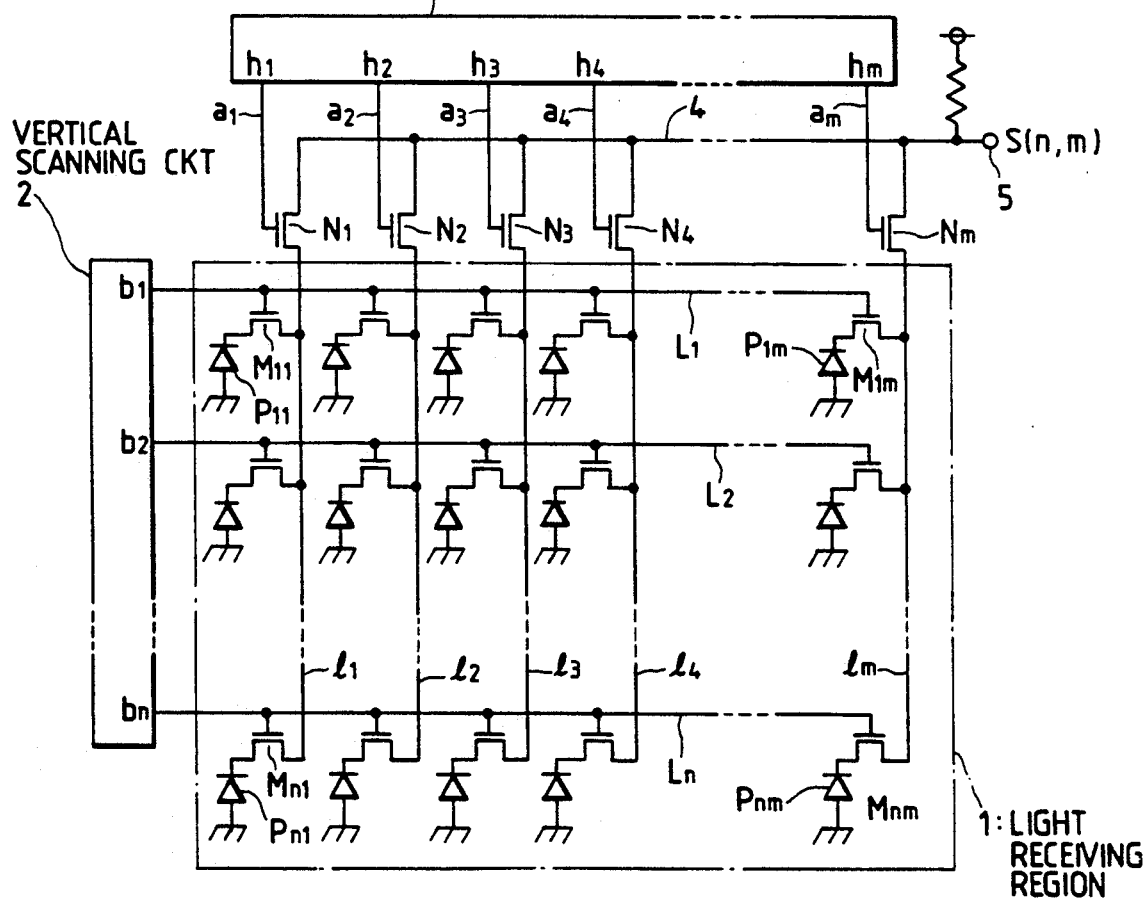
FIG. 5 is a diagram for explaining the construction of a conventional solid-state imaging device.
Figure 6:
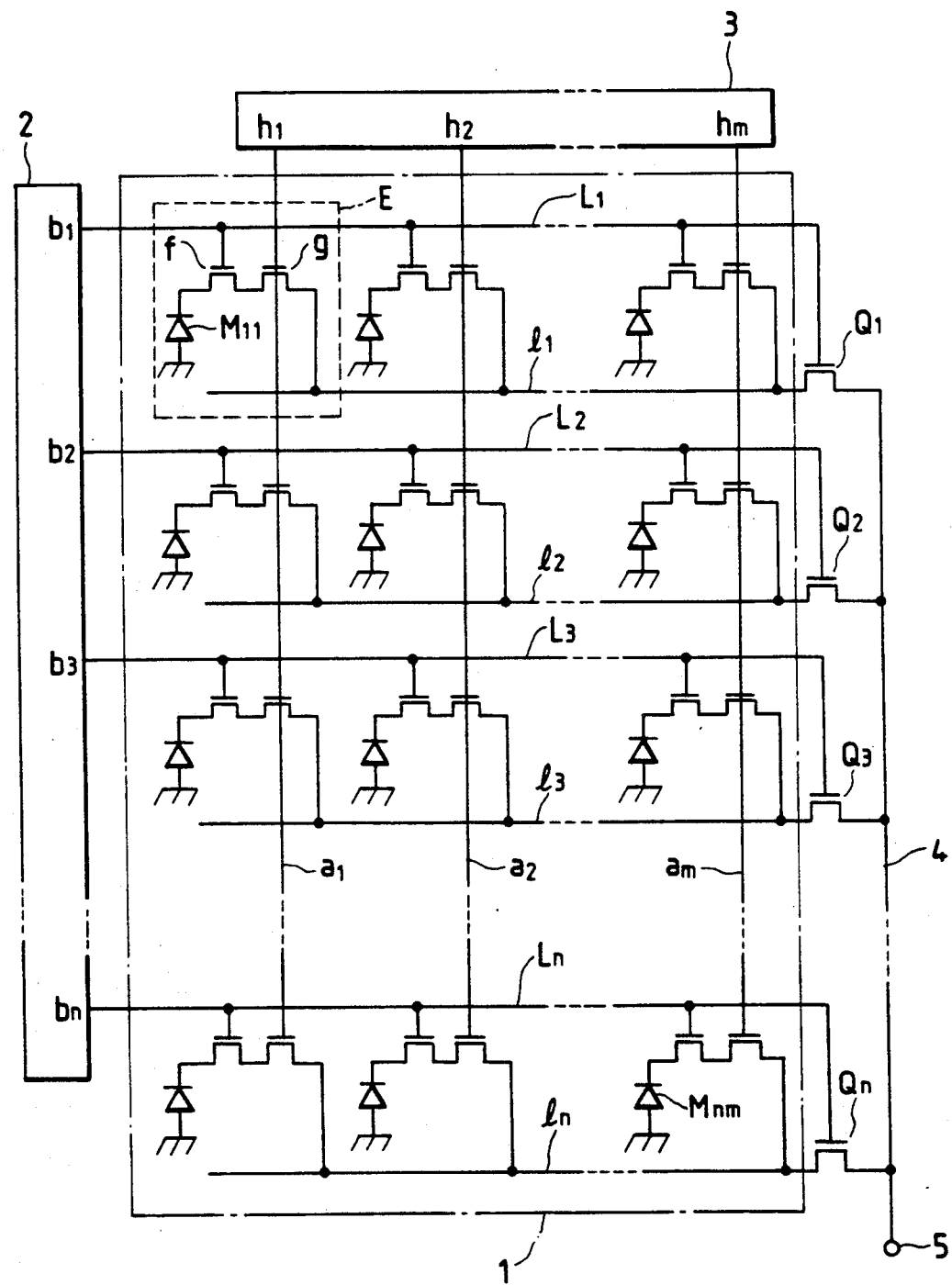
FIG. 6 is a diagram for explaining the construction of another conventional solid-state imaging device.
Figure 7:
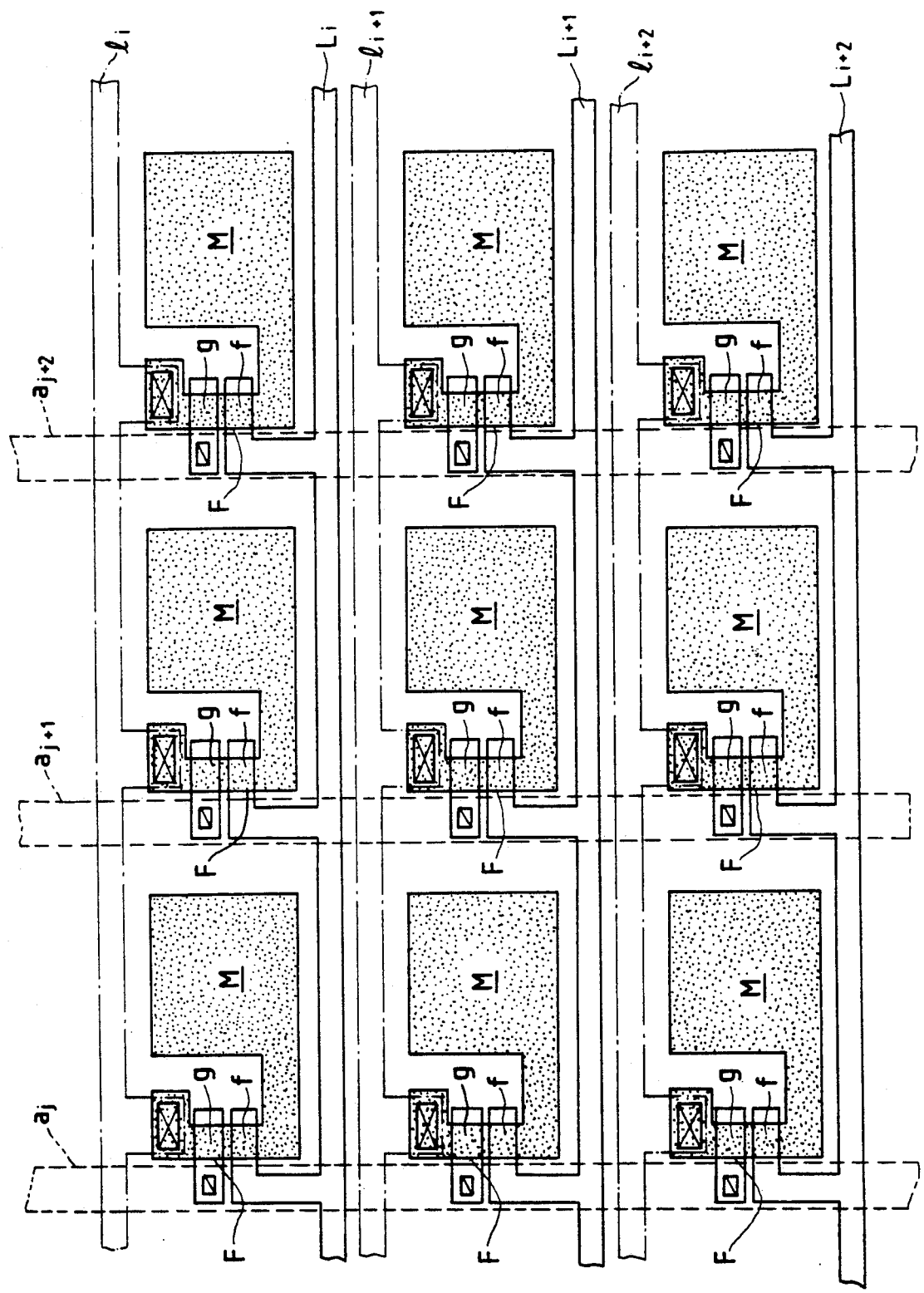
FIG. 7 is a partial plan view for explaining the structure of a light-receiving region of the conventional example shown in FIG. 6.

The general circuit construction will first be described with reference to FIG. 1. In the figure, reference numeral 2 is a vertical scanning circuit composed of shift registers; and 3, a horizontal scanning circuit also composed of shift registers. In a light-receiving region, a plurality of elements E' (shown inside the dotted line in FIG. 1), each composed of a photodiode and a pair of switching transistors that are series-connected thereto and each being of a structure similar to an element E shown in FIG. 5, are arrayed in matrix form. In each element E', a vertical selection gate is connected to the gate contact of the switching transistor that is located closer to the photodiode (designated by f in the figure), while horizontal selection gate lines $a_1$ to $a_m$ are connected to the gate contact of the other switching transistor (designated by g in the figure), the horizontal selection gate lines extending from bit outputs $h_1$ to $h_m$ of the horizontal scanning circuit 3.

This specific examples has eight output lines $R_1$ to $R_8$, which are connected so that eight vertical selection gate lines correspond to the respective bit output contacts of the vertical scanning circuit 2. Such connection allows the pixel signals to be read in parallel every eight columns in synchronism with a horizontal scanning signal from the horizontal scanning circuit 3. Since a cell CE including the plurality $8 \times m$) of photodiodes is formed for each of the bit outputs $b_1$ to $b_n$, the construction of the cell CE connected to the bit output contact $b_1$ of the vertical scanning circuit 2 will be described as a representative example.

Reference characters $L_{1b1}$ to $L_{8b1}$ designate vertical selection gate lines connected in correspondence with eight rows of photodiodes; $l_{1b1}$ to $l_{8b1}$, signal read lines, which are connected to individual output line $R_1$ to $R_8$ through switching transistors $Q_{11}$ to $Q_{18}$.

The vertical selection gate lines $L_{1bl}$ to $L_{8bl}$ are connected to both the gate contacts of the predetermined switching transistors of each element E' and the gate contacts of the switching transistors $Q_{11}$ to $Q_{18}$. Each vertical selection gate line is also connected not only to a terminal VA through switching transistors $K_{1a}$, $K_{2a}$, $K_{3a}$, $K_{4a}$, $K_{5a}$, $K_{6a}$, $K_{7a}$, and $K_{8a}$ that serve to perform an on/off operation in accordance with a vertical scanning signal from the bit output contact $b_1$ of the vertical scanning circuit 2, but also to a terminal VE through switching transistors $K_{1b}$, $K_{2b}$, $K_{3b}$, $K_{4b}$, $K_{5b}$, $K_{6b}$, $K_{7b}$, and $K_{8b}$ that serve to perform an on/off operation in response to a reset signal applied to a terminal R.

Similar cells CE are equally formed for each of the other bit output contacts $b_2$ to $b_n$ of the vertical scanning circuit 2, and the group of signal read lines for each cell are similarly connected in parallel to the eight output lines $R_1$ to $R_8$.

Figure 2:
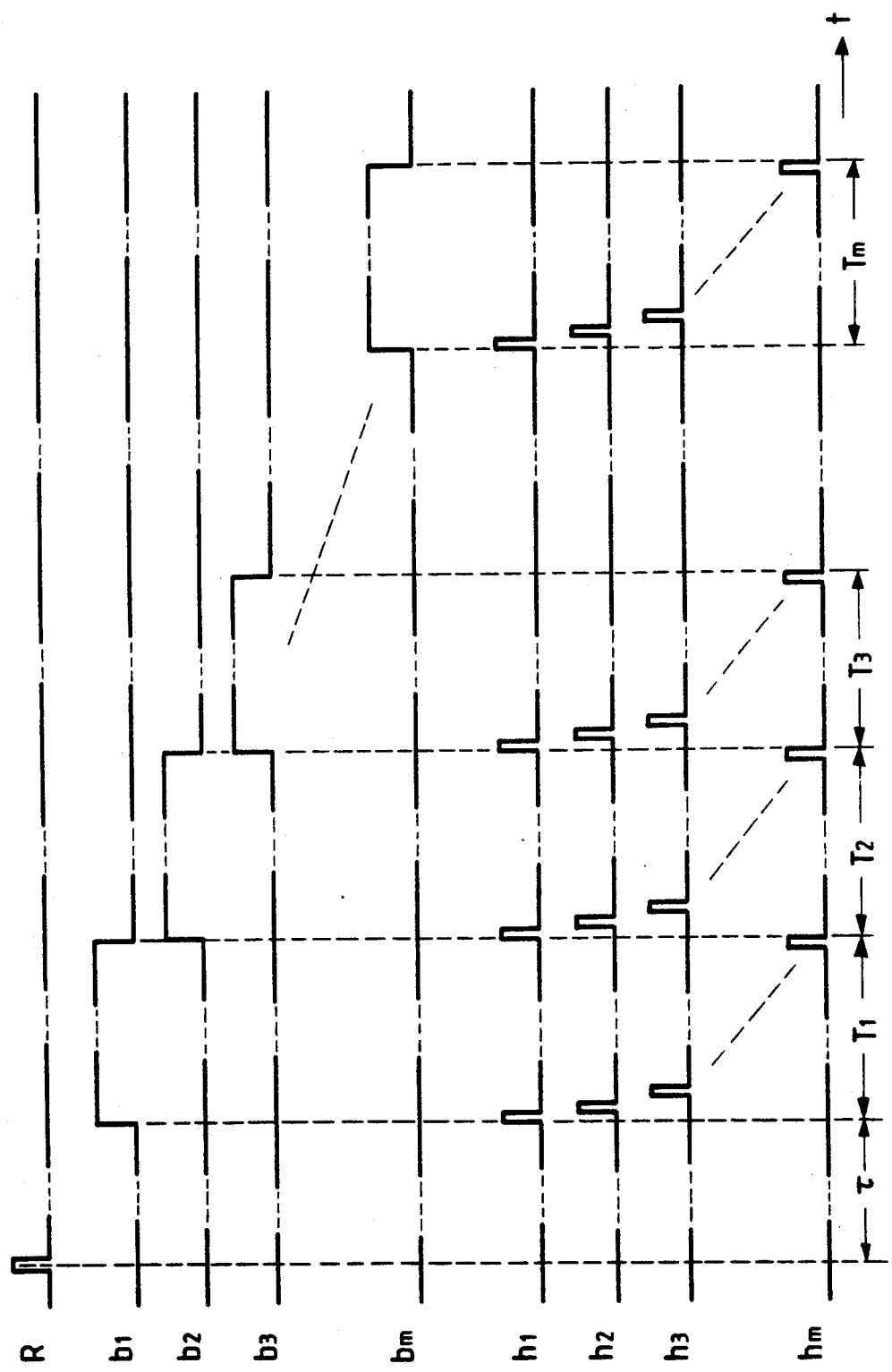
FIG. 2 is a timing chart illustrating the operating principles of the solid-state imaging device of FIG. 1.

The scanning for reading the pixel signals will now be described with reference to the timing chart shown in FIG. 2. Reference characters in FIG. 2 indicate waveforms of the respective terminals in the circuit.

A voltage of, e.g, 5 V is applied to the terminal VA while the terminal VE is set, e.g., to 0 V. When an H-level reset signal is applied to the terminal R, all the vertical selection gate lines are reset to 0 V, and their voltage is made equal to the terminal VA voltage by being synchronized with a vertical scanning signal from each of the bit output contacts $b_1$ to $b_n$ of the vertical scanning circuit 2.

An optical image to be output is received during an appropriate period $\tau$, and when an initial vertical scanning signal is output from the output contact $b_1$ during a predetermined period $T_1$, the switching transistors connected to the vertical selection gate lines $L_{1bl}$ to $L_{8bl}$ of a first cell CE and switching transistors $Q_{11}$ to $Q_{18}$ disposed at its output terminal are turned on. With these switching transistors in the on state, a horizontal scanning signal is sequentially output in a predetermined cycle from each of the bit outputs $h_1$ to $h_m$ of the horizontal scanning circuit 3. As a result, the pixel signals are read every eight rows in parallel. That is, with a horizontal scanning signal from the bit output contact $h_1$ eight pixel signals $S_1$ to $S_8$ in a first column are read, with a horizontal scanning signal from the bit output contact $h_2$ eight pixel signals $S_1$ to $S_8$ in a second column are read, with a horizontal scanning signal from the bit output contact $h_3$ eight pixel signals $S_1$ to $S_8$ in a third column are read, etc. Thus, the pixel signals, being read in parallel in this manner total $8 \times m$ in one horizontal scanning period.

A vertical scanning signal is output every vertical scanning period $T_2$ to $T_n$ from the remaining bit outputs $b_2$ to $b_n$ to perform similar horizontal scanning every vertical scanning period $T_2$ to $T_n$, thereby similarly reading eight pixel signals in parallel from each of the remaining cells during each scanning period.

Accordingly, in this embodiment a plurality of pixel signals are read in parallel during each horizontal scanning operation, thereby allowing rapid signal reading.

The actual structure of the light-receiving region will now be described with reference to FIG. 3, which is a plan view showing a part of the light-receiving region in enlarged form.

Figure 3:
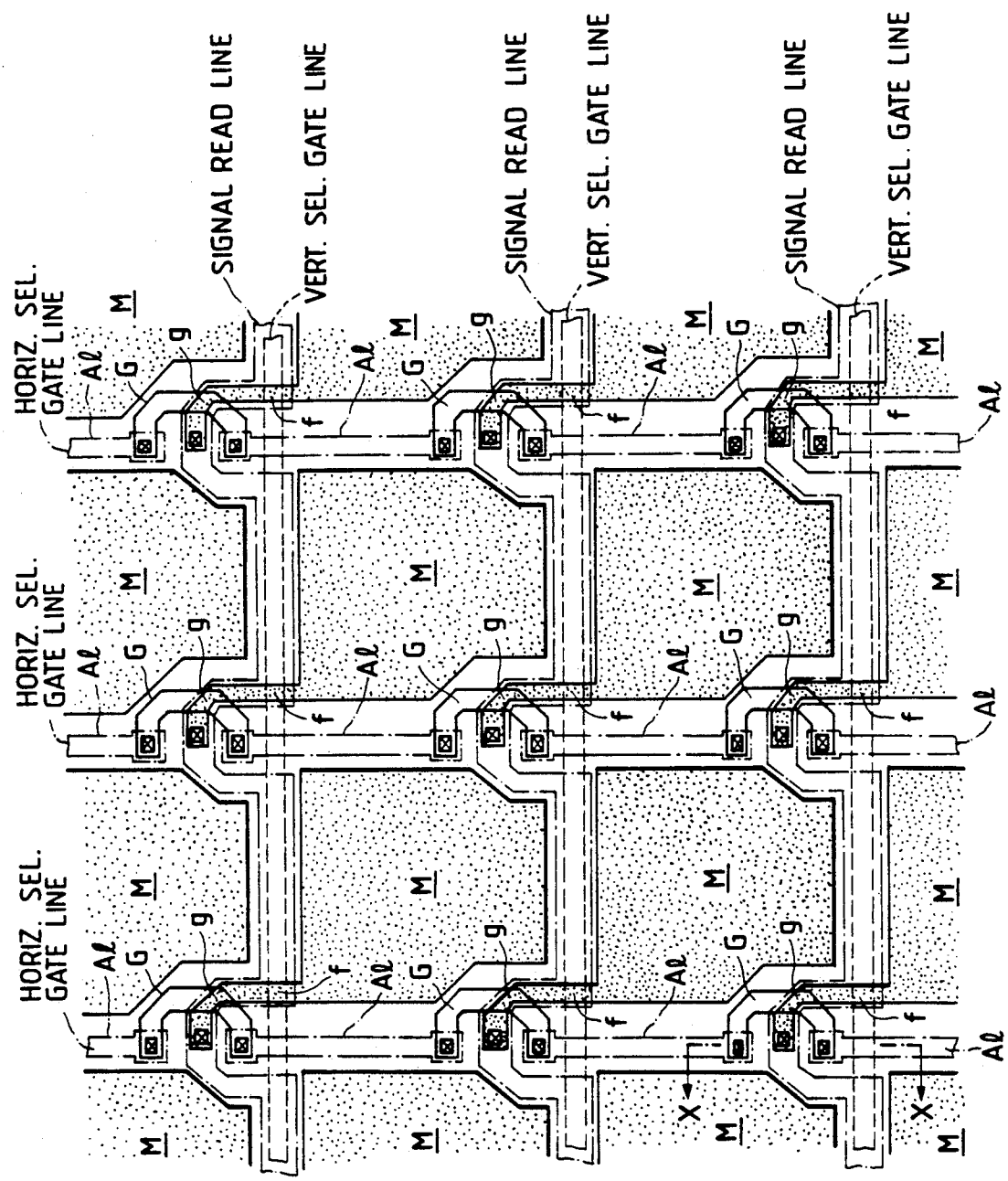
FIG. 3 is a partial plan view for explaining the structure of a light-receiving region of the embodiment of FIG. 1.

Referring to FIG. 3, portions M designate $n^+$ type impurity regions embedded on the surface region of a P-well layer formed inside a semiconductor substrate, each portion M forming a photodiode corresponding to a pixel.

Further, each $n^+$ impurity region is formed so that a part thereof projects outward. Between the $n^+$ impurity regions are formed vertical selection gate lines, each being made of a polysilicon layer (shown by the dotted line in the figure). As shown in the figure, in each vertical selection gate line a first switching transistor (designated by f in the figure) for vertical scanning is formed by first laminating polysilicon layers one upon the other on the upper surface of the projection of each of the horizontally arrayed $n^+$ impurity regions and then implanting ions in these laminations.

Further, a second switching transistor for horizontal scanning (designated by g in the figure) is formed by first laminating a substantially inverted-C shaped gate portion (designated by G in the figure) consisting of the polysilicon layer on a gate oxide film so as to cross over the upper surface of the projection of each photodiode, and then implanting ions in the projection below each lamination thereby to form a second switching transistor (designated by g in the figure).

Both ends of each of these gate portions are sequentially connected by a longitudinally extending aluminum layer (designated by Al in the figure) and the connections are made at contacts designated by ⊠. Each line of connection thus made, forming the horizontal selection gate line, is connected to a respective bit output of the horizontal scanning circuit 3.

Figure 4:
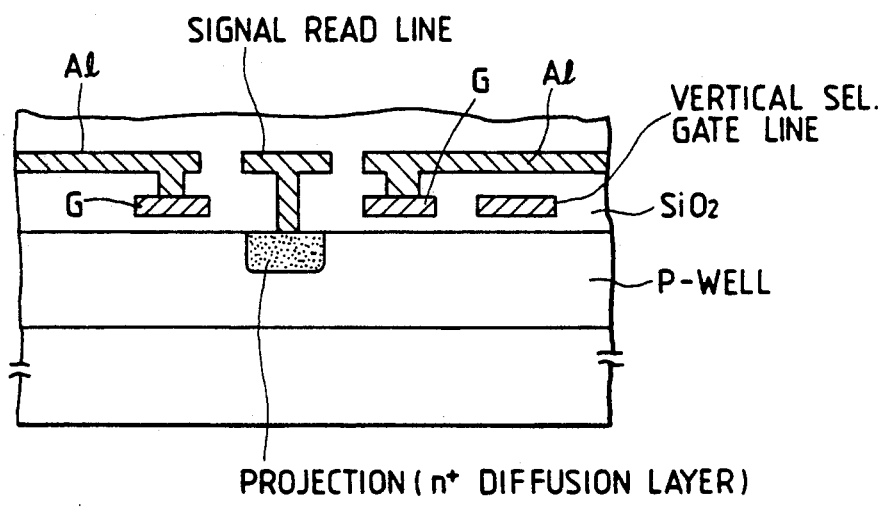
FIG. 4 is a sectional view showing the longitudinal sectional structure taken along a line X—X in FIG. 3.

Further, the terminal portion of the projection of each photodiode is connected to a signal read line (shown by the one-dot chain line in the figure) formed of the Al layer through the contact (designated by ⊠ in the figure). More specifically, each signal read line is not only laminated so as to overlap on the upper surface of the vertical selection gate line interconnected between the n. impurity regions, but also formed so as to cross over the upper side of the gate portion G and pass between the contacts (designated by ⊠) located at both ends of the gate portion so as to avoid contact with the aluminum layer Al. The signal read line is also formed so as to cover the upper surface of the projection of each photodiode in accordance with the shape of the projection. As shown in FIG. 4, the aluminum layer and the polysilicon layer are insulated from each other by a silicon oxide film layer.

During the fabricating process, the aluminum layer for the horizontal selection gate lines and the aluminum layer for the signal read lines are formed simultaneously in accordance with a single mask pattern, while the polysilicon layer for the gate portion G and the polysilicon layer for the vertical selection gate lines are formed simultaneously in accordance with a single mask pattern. These interconnections consist of a single aluminum layer and a single polysilicon layer.

According to this embodiment, the fabrication process of the device is simpler than that of the conventional device, thereby allowing the process yield to be improved. In addition, since the drain part of each switching transistor arranged between each photodiode and each signal read line is shielded by the signal read line made of the aluminum layer, generation of noise due to externally incident light is prevented.

As described above, the invention achieves the formation of the vertical selection gate lines, the horizontal selection gate lines, the signal read lines, and the switching transistors for both vertical and horizontal scanning with a single conductive layer and a single polysilicon layer. The fabrication process is thus simplified, which contributes to improving the yield. In addition, the shielding of the drain portion of each switching transistor arranged between the photodiode and the signal read line by the signal read line made of the conductive layer prevents the generation of noise due to externally incident light.

Further, according to the above embodiment, a parasitic capacitor is provided by forming the signal read lines and the vertical selection gate lines while laminating them one on the other, and the silicon oxide film between these lines is thin. Hence, it is possible to increase the capacitance compared to the conventional device, thereby allowing the dynamic range to be increased.

Since the voltage at each vertical selection gate line is kept constant even if an image is being scanned horizontally by a horizontal scanning signal from the horizontal scanning circuit during the horizontal scanning period, there is no variation in potential of the vertical selection gate lines, thereby allowing the DC potential of each signal read line to be stably maintained. This means that the charging voltage of each signal read line is held constant and stable, leading to an advantage of improved accuracy of reading the pixel signals.

What is claimed is:

1. A solid-state imaging device comprising:
   a plurality of photodiodes arrayed in matrix form so as to serve as a group of pixels, each of said photodiodes having a surface region of a predetermined shape and a projection, said projection having first and second portions, said first portion of said projection being located between said region and said second portion;
   a vertical scanning circuit;
   a horizontal scanning circuit;
   a plurality of vertical selection gate lines extending from said vertical scanning circuit, each of said vertical selection gate lines being formed from a polysilicon material;
   a plurality of horizontal selection gate lines extending from said horizontal scanning circuit;
   a plurality of signal read lines interconnected between said photodiodes; wherein each of said pixels comprises:
      a first switching transistor, disposed between a corresponding one of said photodiodes and a predetermined signal read line, for performing an on/off operation in synchronism with a vertical scanning signal transmitted from said vertical scanning circuit through a respective one of said vertical selection gate lines; and
      a second switching transistor for performing an on/off operation in synchronism with a horizontal scanning signal transmitted from said horizontal scanning circuit through a respective one of said horizontal selection gate lines so as to permit a pixel signal from said corresponding one of said photodiodes to be read in synchronism with signal read line scanning at a predetermined timing by said vertical scanning circuit and said horizontal scanning circuit;
      said first switching transistor being formed by interconnection of a corresponding one of said vertical selection gate lines overlapping said first portion of a corresponding one of said projections; and
      said second switching transistor comprising a vertically oriented gate portion made of said polysilicon material overlapping said second portion of said corresponding one of said projections;
   wherein each of said horizontal selection gate lines comprises a plurality of vertically aligned ones of said gate portions serially coupled by predetermined portions of a first conductive layer, said first conductive layer being located above and insulated from a second conductive layer comprising said polysilicon material; and
   said signal read lines comprising a plurality of predetermined portions of said first conductive layer, each signal read line being located so as to shield said projection and said first and second switching transistors, said signal read lines being insulated from said horizontal selection gate lines.

2. The solid-state imaging device of claim 1, wherein a plurality of said vertical selection gate lines and said signal read lines are provided for each output of said vertical scanning circuit.

3. The solid-state imaging device of claim 2, further comprising, for each of said vertical selection gate lines, a third switching transistor for connecting said vertical selection gate line to a first potential source in response to an output signal from said vertical scanning circuit, and a fourth switching transistor for connecting said vertical selection gate line to a second potential source in response to a reset signal.

4. The solid-state imaging device of claim 3, further comprising, for each of said vertical selection gate lines, a fifth switching transistor, having a gate connected to a respective one of said vertical selection gate lines, for connecting a respective one of said signal read lines to a respective signal output line.

5. The solid-state imaging device of claim 1, wherein each of said vertical selection gate lines is formed of a laminated polysilicon layer.

6. The solid-state imaging device of claim 1, wherein each of said signal read lines is formed of a first aluminum layer, and each of said horizontal selection gate lines is formed of a second aluminum layer.

7. A solid-state imaging device comprising:
   a plurality of photodiodes arrayed in a matrix, each of said photodiodes defining a pixel an each of said photodiodes having a surface region of a predetermined shape and a projection, said projection having first and second portions, said first portion of said projection being located between said surface region and said second portion;
   a vertical scanning circuit;
   a horizontal scanning circuit;
   a first conductive layer located substantially parallel to and insulated from said projection of each of said photodiodes, said first conductive layer having a plurality of first linear portions and a plurality of first curved portions, said first conductive layer being formed of a polysilicon material;
   a second conductive layer located substantially parallel to and insulated from said first conductive layer, said second conductive layer having a plurality of second linear portions and a plurality of second curved portions, said second conductive layer being formed from a second conductive material;
   wherein each of said pixels further comprises:
      a first switching transistor comprising a selected one of said first linear portions operatively coupled to a corresponding one of said projections at said first portion; and a second switching transistor comprising a vertically oriented one of said first curved portions operatively coupled to a corresponding one of said projections at said second portion;

a plurality of vertical selection gate lines, each of said vertical selection gate lines comprising horizontally aligned ones of said selected first liner portions and a plurality of other first linear portions, each of said vertical selection gate lines being operatively coupled to said vertical scanning circuit;

a plurality of horizontal selection gate lines, each of said horizontal selection gate lines comprising vertically aligned ones of said selected first curved portions serially coupled to vertical ones of said second linear portions, each of said horizontal selection gate lines being operatively coupled to said horizontal scanning circuit; and a plurality of read signal lines interconnected between said photodiodes, each of said read signal lines comprising horizontally aligned ones of said second curved portions serially coupled to a plurality of horizontal ones of said second linear portions, each of said signal read lines being located so as to electrically shield said projection and said first and second switching transistors; wherein each of said first switching transistors is operatively coupled between a corresponding one of said photodiodes and a predetermined signal read line so as to permit an on/off operation in synchronism with a vertical scanning signal transmitted from said vertical scanning circuit through a respective one of said vertical selection gate lines; and wherein each of said second switching transistors is operatively coupled so as to provide an on/off operation in synchronism with a horizontal scanning signal transmitted from said horizontal scanning circuit through a respective one of said horizontal selection gate lines to permit a pixel signal from said corresponding one of said photodiodes to be read in synchronism with signal read line scanning at a predetermined timing by said vertical scanning circuit and said horizontal scanning circuit.

8. The solid-state imaging device of claim 7, wherein a plurality of said vertical selection gate lines and said signal read lines are provided for each output of said vertical scanning circuit.

9. The solid-state imaging device of claim 8, further comprising, for each of said vertical selection gate lines, a third switching transistor for connecting said vertical selection gate line to a first potential source in response to an output signal from said vertical scanning circuit, and a fourth switching transistor for connecting said vertical selection gate line to a second potential source in response to a reset signal.

10. The solid-state imaging device of claim 9, further comprising, for each of said vertical selection gate lines, a fifth switching transistor, having a gate connected to a respective one of said vertical selection gate lines, for connecting a respective one of said signal read lines to a respective signal output line.

11. The solid-state imaging device of claim 7, wherein said first conducting layer comprises a laminated polysilicon layer.

12. The solid-state imaging device of claim 7, wherein said second conductive layer further comprises first and second aluminum layers, and wherein each of said signal read lines is formed of said first aluminum layer, and each of said horizontal selection gate lines is formed of said second aluminum layer.

* * * * *